(12) United States Patent
Clar et al.

(10) Patent No.: US 7,903,351 B2
(45) Date of Patent: Mar. 8, 2011

(54) ACTIVE COOLING OF CRYSTAL OPTICS FOR INCREASED LASER LIFETIME

(75) Inventors: Colleen Renee Clar, Victor, NY (US); William Rogers Rosch, Corning, NY (US); Horst Schreiber, Rochester, NY (US); Charlene Marie Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 391 days.

(21) Appl. No.: 11/708,816

(22) Filed: Feb. 21, 2007

(65) Prior Publication Data

US 2008/0198882 A1 Aug. 21, 2008

(51) Int. Cl.
*G02B 7/02* (2006.01)
(52) U.S. Cl. ............... 359/811; 359/820; 372/20
(58) Field of Classification Search .......... 359/811, 359/819, 820; 372/20, 36
See application file for complete search history.

(56) References Cited

U.S. PATENT DOCUMENTS

| 6,989,060 | B2 * | 1/2006 | Kuwabara | 117/3 |
| 7,535,936 | B2 * | 5/2009 | Day et al. | 372/20 |

OTHER PUBLICATIONS

M.F. Koldunov, A. A. Manenkov, I.L. Pocotile, Multishot laser damage in transparent solids: theory of accumulation effect, Laser Induced damage in optical materials 1994, Boulder (USA), SPIE 2428, 653 (1994).
O. Kittelamn and J. Ringling: Intensity-dependent transmission properties of window materials at 193-nm irradiation, Opt. Lett. 19, 2053 (1994).
K. Mann, B. Granitza and E. Eva: Multiple-pulse damage thresholds of optical components for excimer lasers, Proc. of Boulder Damage Symposium, Boulder (USA), 1996, SPIE 2966 (1996).
V. Nathan and A. H. Guenther: Review of multiphoton absorption in crystalline solids, J. Opt. Soc. Am B 2, 294 (1985).
I. A. Mironov, V. M. Reiterov, A. P. Sergeev, Paul B. Sergeev, and Vladimir D. Zvorykin, High-purity $CaF_2$ as a material for windows of powerful excimer lasers, Proc. SPIE 5479, 135 (2004).

* cited by examiner

*Primary Examiner* — Timothy J Thompson
(74) *Attorney, Agent, or Firm* — Timothy M Schaeberle

(57) ABSTRACT

A laser beam is generated and transmitted within an enclosed pathway through at least one crystal optic at a power density that progressively degrades transmissivity of the crystal optic with accumulating fluence. The crystal optics are cooled below normal operating temperatures to slow the progressive degradation in the transmissivity of the crystal optics with the accumulating fluence or to accommodate a higher power density without correspondingly increasing the progressive degradation in transmissivity.

8 Claims, 4 Drawing Sheets

ACTIVE COOLING OF CRYSTAL OPTICS FOR INCREASED LASER LIFETIME

TECHNICAL FIELD

The invention relates to cooling systems for reducing the operating temperatures of optical elements, particularly optical elements intended for transmitting high concentrations of light energy within housings or other enclosed pathways.

BACKGROUND OF THE INVENTION

Lasers arranged for light intensive activities, such as photolithography, can be expensive to operate and maintain. Part of this cost relates to stringent requirements for conditioning laser beams and another part of this cost relates to the limited service lives of such lasers between required refurbishing. The beam-conveying optics, which are often located in an isolated environment within a laser housing or other enclosed pathway, participate in such activities as beam amplification, beam shaping, wavelength selection, and bandwidth control. High-power lasers, such as Excimer lasers and frequency-doubled solid-state lasers, generate high concentrations of light energy that can progressively damage the beam-conveying optics.

While it is generally possible to replace one or more of the beam-conveying optics following a predetermined degradation in laser performance, such as a reduction in laser output power associated with reduced transmissivity of the optics, downtime associated with such reconditioning can be expensive, both as a refurbishing exercise and as a loss of production. For example, a four to five percent reduction in transmissivity of an individual optical component is often enough to require its replacement.

The service lives of high-power lasers are generally measured in terms of billions of shots, referring to a number of pulses generated by the laser. For example, Excimer lasers used in photolithographic operations have service lifetimes of around five to ten billion shots before some refurbishing becomes necessary. That is, such lasers require significant servicing on a regular basis depending upon their amount of use.

Ongoing application trends demand ever higher average power, which can further reduce the expected service lives of the lasers and add significantly to their cost of ownership. Higher photon intensities associated with shorter wavelengths, now commonly within the deep ultraviolet spectrum, limit the choices of optical materials meeting transmissivity requirements. Birefringence and other optical performance measures also disqualify many optical materials at the shorter wavelengths.

Laser performance is also temperature sensitive because most of the available optical materials tend to expand with the application of heat, i.e., have significant coefficients of thermal expansion. Thus, the optical components are specially designed to operate at a constant elevated operating temperature of the laser, e.g., around 40 degrees Celsius. Attempts have been made to increase the service lives of the optical components by choosing among the available materials and by reducing impurities within the materials, which are expected to increase absorption. However, the material choices even among different manufacturers remain limited and further reductions in impurities have only marginally improved results.

BRIEF SUMMARY OF THE INVENTION

The invention is based partly on a discovery that reducing the operating temperatures of beam-conveying optics can significantly reduce degradation in the optics associated with the transmission of high concentrations of light energy. In particular, fluoride crystal materials such as calcium fluoride have been found to benefit from the reduction in operating temperature. Retarding transmission losses in the beam-conveying optics extends the service lives of high-power lasers, which reduces production downtime and lowers the overall cost of laser operation and ownership.

Actively cooling the fluoride crystal optics reduces the rate at which transmission declines with accumulating fluence (e.g., numbers of laser pulses). Although the exact mechanism by which the reduction in temperature reduces the rate of transmission decline is not clearly understood, the slower atomic motion associated with the lower temperatures is believed to reduce the mobility of fluorine ions and improve their chances of recombining with their cations within the crystal lattice after being temporarily disassociated by interactions with high energy photons. Reductions in transmissivity are associated with increased absorption and a corresponding increase in temperature. By both delaying the onset of significant absorption and reducing the subsequent temperature increases associated with absorption, active cooling is believed to contribute to the slower degradation in the fluoride crystal optics.

One version of the invention as a laser system includes a laser for generating the laser beam and an enclosed pathway within which the laser beam is conveyed. The laser has a predetermined operating temperature. A crystal optic, which has a service life associated with a threshold reduction in transmissivity, transmits the laser beam within the enclosed pathway at a predetermined concentration of light energy. An active cooling system in thermal contact with the crystal optic lowers a nominal temperature of the crystal optic below the operating temperature of the laser to extend the service life of the crystal optic or accommodate a higher concentration of light energy without correspondingly shortening the service life.

The active cooling system preferably includes a cooling module thermally engaged with the crystal optic for conveying heat from the crystal optic. In the case of plane-parallel, spherical, or aspheric optics, the cooling module preferably provides for maintaining a symmetric thermal gradient about an optical axis of the crystal optic. Alternatively, in the case of prisms, the cooling module preferably maintains a balanced thermal gradient between prism end faces.

For example, the cooling module can include one or more thermoelectric cooling element. The multiple thermoelectric cooling elements are preferably distributed symmetrically about the optical axis of the crystal optic. A thermal conductor for engaging a periphery of the crystal optic can be used in conjunction with the cooling elements to withdraw heat in a more uniform, balanced, or symmetric manner. For example, the thermal conductor in the form of a heat pipe can be wrapped around the periphery of the crystal optic. The one or more cooling elements can be mounted in thermal communication with the thermal conductor for extracting heat from the crystal optic.

The enclosed pathway preferably provides a closed atmospheric environment. A humidity limiting system can be used to limit the condensation of water vapor onto the crystal optic in association with the active cooling of the crystal optic. The humidity limiting system can include a cooling element exposed within the closed atmospheric environment of the pathway and having a temperature less than a contemporaneous temperature of the crystal optic. The closed atmospheric environment can be filled with an inert gas that is maintained at a reduced humidity with respect to an environment outside the enclosed pathway.

The active cooling system transfers heat to produce a temperature difference between a thermal conductor in thermal contact with the crystal optic and a heat dissipater. The thermal conductor extracts heat from the crystal optic within the closed atmospheric environment of the pathway, and the heat dissipater expels the extracted heat from the crystal optic, preferably outside the closed atmospheric environment of the pathway. In the preferred thermoelectric cooling devices, electrical current induces the temperature difference between the thermal conductor and the heat dissipater. However, a change in fluid pressure could also be used to induce a similar temperature difference.

The crystal optic is preferably but one of a plurality of crystal optics within the enclosed pathway for transmitting light generated by the laser, and the active cooling system is preferably but one of a plurality of active cooling systems for extracting heat generated by the laser beam from the plurality of crystal optics to extend the collective service lives of crystal optics. For example, at least one of the crystal optics preferably functions as a window for confining a laser medium gas within a lasing chamber. Another of the plurality of crystal optics can take the form of a prism for conditioning the laser beam, and the active cooling system thermally engages one or more faces of the prism that are not used for transmitting the laser beam.

The crystal optic is preferably made of a compound that is assembled from ions that include fluoride. For example, calcium fluoride and magnesium fluoride crystals can be used for the crystal optic. The light-receiving surfaces of the crystal optic can be shaped in anticipation of the lower expected operating temperature. Where necessary for achieving required accuracy, the crystal optics can be specially shaped to accommodate local distortions or refractive index changes associated with the expected temperature profiles of the crystal optics.

Another version of the invention improves a crystal optical component for transmitting light at concentrations that progressively degrade the transmissivity of the component. A crystal body of the optical component has a light transmitting region surrounding an optical axis. An active cooling system extracts heat from the crystal body for reducing a rate at which the crystal body degrades in transmissivity or for accommodating higher concentrations of light without correspondingly increasing the progressive degradation in transmissivity. The active cooling system is arranged in thermal contact with multiple portions of a periphery of the crystal body to extract heat symmetrically with respect to the optical axis.

The periphery of the crystal body can be rotationally symmetric with respect to the optical axis, and the active cooling system can be arranged to thermally contact evenly distributed portions of the rotationally symmetric periphery of the crystal body. Alternatively, the periphery of the crystal body can include faces disposed on opposite sides of the optical axis, and the active cooling system can be arranged to contact both faces.

The active cooling system preferably includes at least one conductor in thermal contact with the periphery of the crystal body, a heat dissipater remote from the crystal body, and a powered thermal module that produces a temperature difference between the conductor and the heat dissipater. The conductor can be a heat pipe, and the powered thermal module can be a thermoelectric element. The crystal body is preferably made of a compound that is assembled from ions that include fluoride. For example, the crystal body can be made of calcium fluoride. A transmissive surface of the crystal body can be modified in shape to compensate for optical path length variations through the crystal body produced by temperature gradients within the crystal body.

The invention can also be practiced as a method of extending service lives of crystal optics that transmit concentrated laser beams. The laser beam is generated by a laser and is transmitted within an enclosed pathway through at least one crystal optic at a power density that progressively degrades transmissivity of the crystal optic with accumulating fluence. The crystal optic is actively cooled to slow the progressive degradation in the transmissivity of the crystal optic with the accumulating fluence or to accommodate a higher power density without correspondingly increasing the progressive degradation in transmissivity.

In addition, humidity is preferably limited within the enclosed pathway to avoid condensation of water vapor onto a transmitting region of the actively cooled crystal optic. A coldest portion of the crystal optic within the transmitting region can be cooled to a temperature above the freezing point of water, but preferably less than five degrees Celsius above the freezing point of water. Humidity can be further limited by actively cooling a portion of the space within the enclosed pathway to a temperature less than a contemporaneous temperature of the transmitting region of the crystal optic. The coldest portion of the crystal optic within the transmitting region can then be cooled to a temperature below the freezing point of water.

The crystal optic can be made of a compound that is assembled from ions that include fluoride, and the active cooling of the crystal optic allows the fluoride ions dissociated from their cations by the transmitted laser beam to remain close enough to their cations to enable reassembly of the fluoride compound between photon interactions. Preferably, the temperature of the crystal optic is progressively reduced at a rate that limits stress induced by temperature gradients with the crystal optic. The active cooling of the crystal optic also preferably maintains temperature gradients that are symmetric with respect to the optical axis. For example, heat can be extracted from the crystal optic through a plurality of positions about a periphery of the crystal optic. A transmissive surface of the crystal optic can be modified in shape to compensate for optical path length variations through the crystal optic produced by temperature gradients within the crystal optic.

BRIEF DESCRIPTION OF THE DRAWING FIGURES

DETAILED DESCRIPTION OF THE INVENTION

Figure 1:
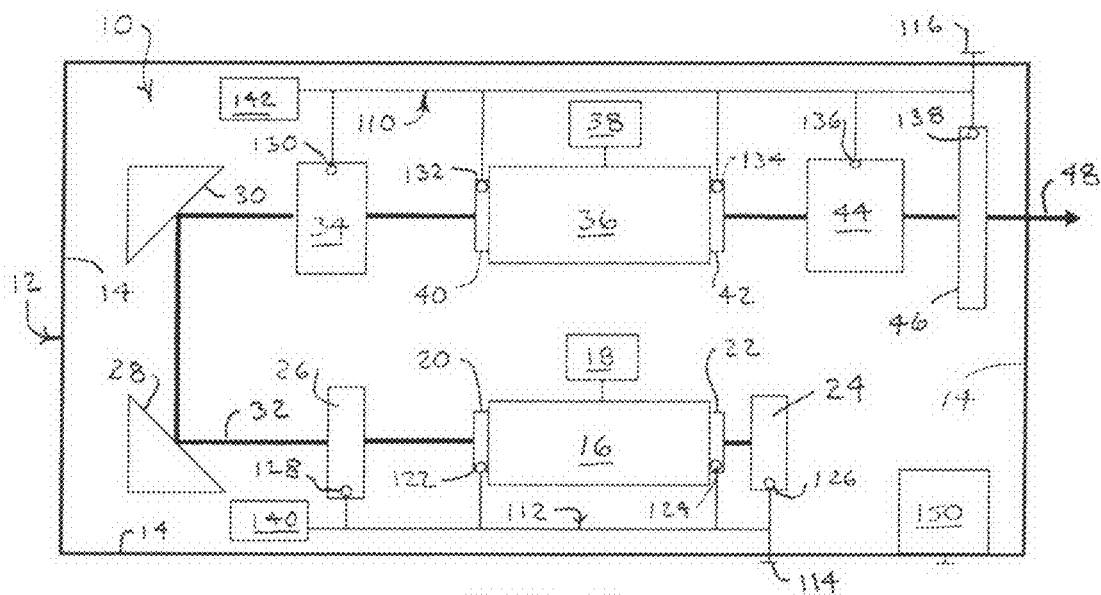
FIG. 1 is a diagram of a laser beam generating apparatus incorporating beam-conveying optics having actively cooled crystal optical components.

A laser generating apparatus 10 as depicted in FIG. 1 is mounted within a housing 12 providing an enclosed pathway for isolating the laser generating apparatus from a surrounding environment. The housing 12 is preferably filled with an inert gas, such as nitrogen $N_2$. The walls 14 of the housing 12 can also be arranged to insulate the contents of the housing 12 from changes in ambient temperature.

The laser generating apparatus 10 includes a gas-filled oscillator 16 powered by a control module 18. A gain medium is confined within the oscillator 16 by windows 20 and 22. A resonant cavity is formed through the oscillator between a line-narrowing module 24 and an output coupler 26. Mirrors 28 and 30 convey a developing laser beam 32 to a beam shaper and aligner 34 in advance of an amplifier 36. A control module 38 powers the amplifier 36 to augment and stabilize pulse energy. The amplifier 36 can be arranged as a similar discharge chamber with windows 40 and 42 arranged for confining a lasing medium. Additional optics, not shown, can be used to produce resonance through the amplifier to maximize power output. A beam expander 44 widens the developing laser beam 32 (spatially separates the pulse photons) and a pulse extender 46 lengthens the pulses within the developing laser beam 32 (temporally separates pulse photons), both with the effect of reducing power density while maximizing per pulse energy of a resulting output laser beam 48.

Additional conditioning optics can be used for such purposes as shaping, homogenizing, polarizing, or steering the output beam 46 within the housing 12, a different enclosed pathway, or other chosen environment. Although the invention is concerned with the transmission of high-energy pulses, particularly within enclosed pathways, such as the laser housing 12, the way in which the laser pulses are produced or conditioned is of lesser concern. The high per pulse fluence transmitted by these optics, which is often highest during or close to the generation of the output beam, is of more concern. In addition to per pulse fluence, pulse duration, intra-pulse and inter-pulse variations, the physical concentration of pulses, the rate at which pulses are administered, and the total number of administered pulses, can all affect the rate of transmission degradation undergone by the transmissive optics.

The rate of transmission degradation, however, can be reduced by lowering the temperatures of the transmitting optics subject to the transmission of high concentrations of light energy. Conversely, reducing the temperatures of the transmitting optics allows the same optics to transmit higher concentrations of light energy without increasing the rate of transmission degradation. Thus, the service life of the optics can be extended, increased concentrations of light energy can be transmitted within a given service life, or a combination of some extended service life with some increased concentrations of light energy can be realized.

Figure 2:
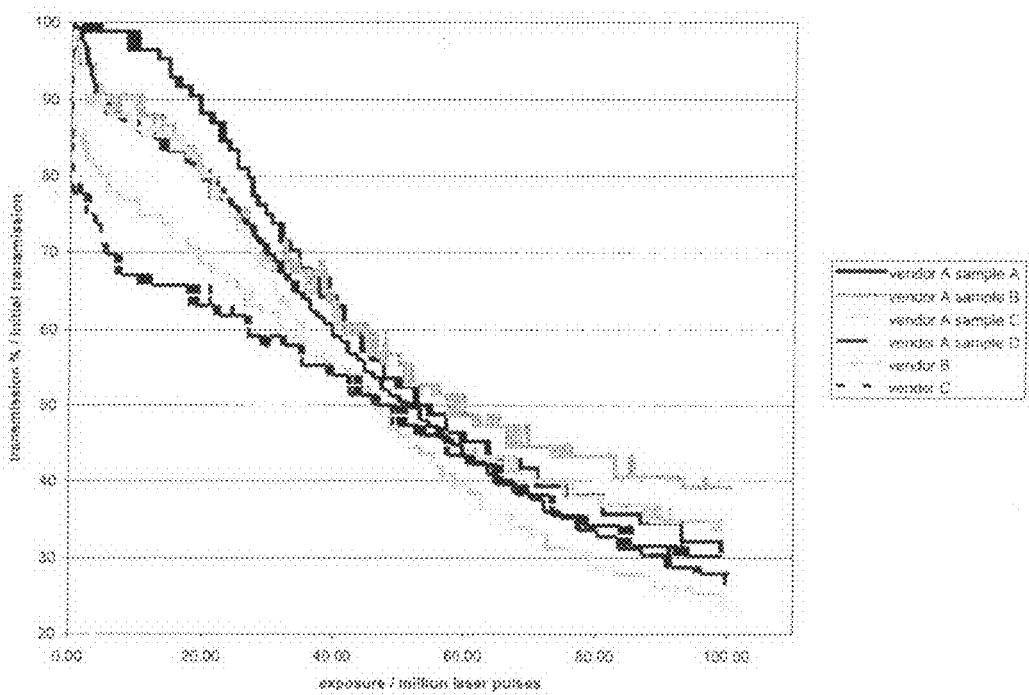
FIG. 2 is a graph plotting transmission as a function of numbers of shots (i.e., pulses) showing that various forms of calcium fluoride crystal materials having different purity levels and crystal structure qualities (sub-grain boundaries) or different manufacturing protocols all decline in transmissivity with numbers of shots toward a similarly reduced transmissivity value.

FIG. 2 plots transmissions of various calcium fluoride crystal materials at different purity levels supplied from different manufacturers in milliwatts (mW) of transmission as a function of millions of shots (i.e., pulses). The per-pulse fluencies exceed 250 millijoules (mj) at nominal wavelengths of 193 nanometers. All of the crystal materials show a significant decrease in transmission over a span of approximately 100 million shots. The different starting transmission values possibly depend upon surface effects.

Figure 3:
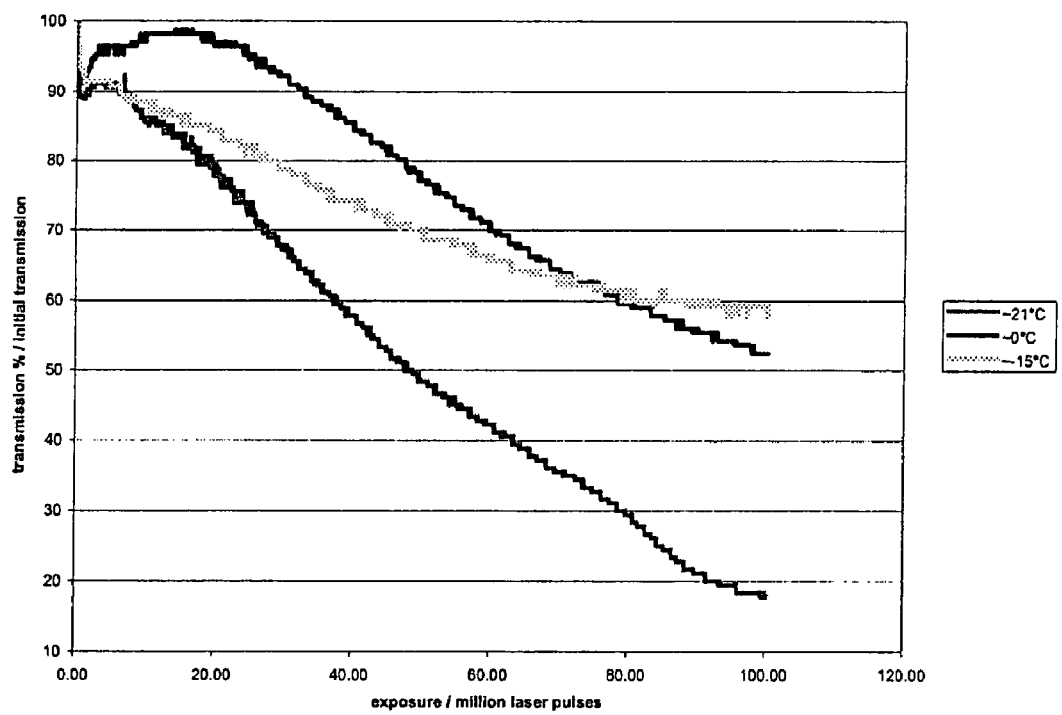
FIG. 3 is a similar graph showing different rates of transmission decline with fluence for the same calcium fluoride crystal material at three different temperatures.

FIG. 3 shows transmissions through a single calcium fluoride crystal material chilled to three different temperatures ranging from near room temperature (~24° C.) to near freezing (~2.5° C.). The calcium fluoride crystal material chilled to the lowest temperature showed the least decline in transmissivity between zero and 100 million pulses.

Figure 4:
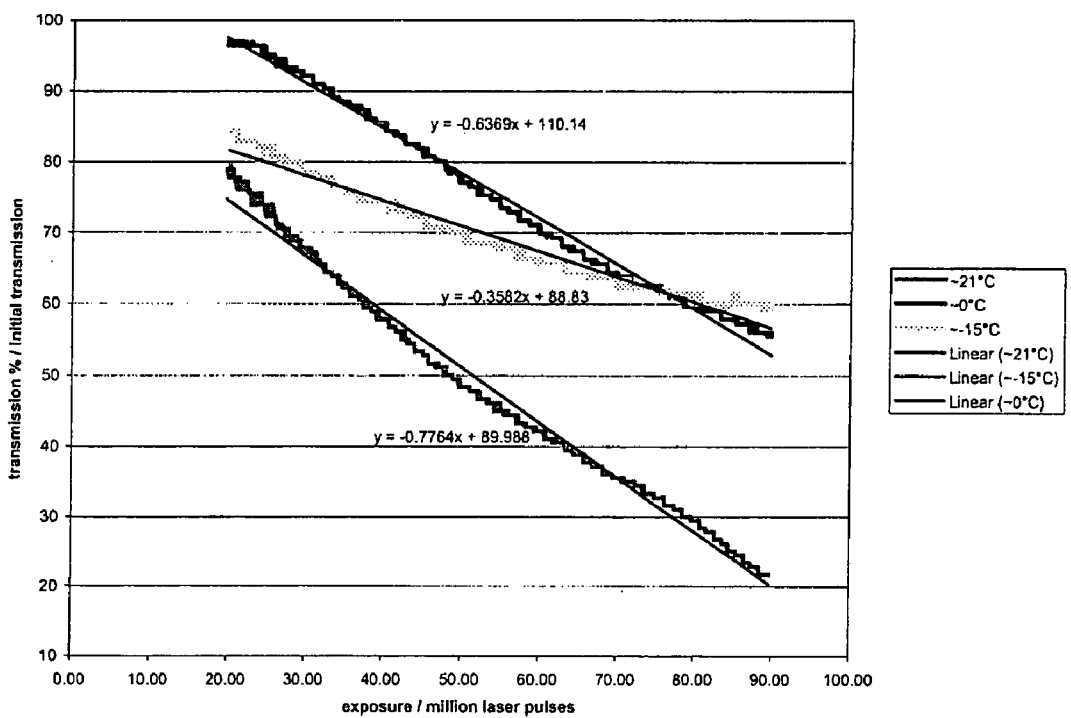
FIG. 4 is a graph showing a more limited range of fluence over which the transmission declines in an approximately linear manner at each of the three temperatures.

Plotted over a more limited range of pulses between 10 million and 100 million, as shown in FIG. 4, the decline rates at the different temperatures are approximately linear. The calcium fluoride crystal material chilled to the lowest temperature exhibited the lowest absolute slope (~32% transmission drop per 100 million laser pulses), and the calcium fluoride crystal material at near room temperature exhibited the highest absolute slope (~77% transmission drop per 100 million laser pulses). The calculated slope, which represents the rate at which transmission decreases with increasing numbers of pulses, decreases significantly with decreases in the temperature of the transmitting crystal material. Extrapolating on this data, further decreases in the temperature of the crystal material are expected to continue to reduce the rate of transmission decline. Other optical crystal materials, such as magnesium fluoride having fluoride bonding and similar electron band gaps, are expected to behave similarly.

Figure 5:
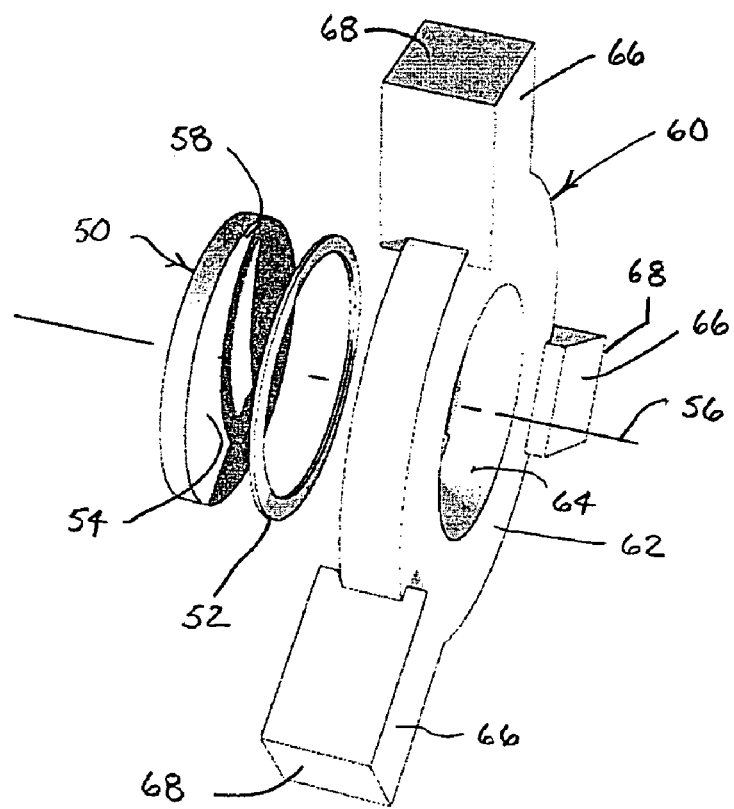
FIG. 5 is an exploded perspective view of a conventional lens element and a cooling module mounting system.
Figure 6:
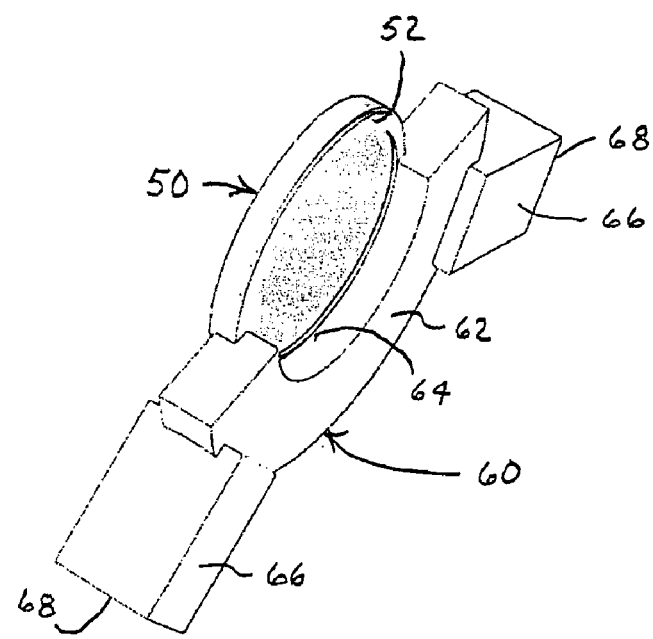
FIG. 6 is a cut-away perspective view of the cooling module mounting system engaging the periphery of the lens element.

The crystal optics within the laser generating apparatus 10 can be cooled in a variety of ways. For example, FIGS. 5 and 6 illustrate a conventional lens 50 made of a crystal material, such as calcium fluoride, and a cooling module lens mount 60 arranged for thermal communication with the conventional lens 50 through a thermal interface ring 52. The conventional lens 50 has a crystal body 54 for transmitting light along an optical axis 56, and a periphery 58 (i.e., a region beyond the intended optical transmitting region of the crystal body) engaged by the thermal interface ring 52 for conducting heat from the crystal lens 50 to the cooling module lens mount 60.

The cooling module lens mount 60 functions as both a lens mount and as a cooler for withdrawing heat from the lens 50. An annular conductive body 62 (i.e., a thermal conductor) of the cooling module lens mount 60 is made of a conductive material, such as aluminum, stainless steel, copper, or brass, for functioning as a heat pipe. An inner surface 64 of the conductive body 62 engages the thermal interface ring 52 for conducting heat from the lens 50 into the conductive body 62. The inner surface 64 also functions to hold the lens 50 within the conductive body 62. Three cooling elements 66 are arranged about the periphery of the conductive body 62 in thermal communication with the conductive body 62 to power the withdrawal of heat from the lens 50. The cooling elements 66 transfer heat from the conductive body 62 to heat dissipaters 68 remote from the lens 50. The cooling elements 66 are preferably arranged to extract heat from the crystal body 52 of the lens 50 symmetrically with respect to the optical axis 56.

The cooling module lens mount 60 can be arranged with integrated or separate cooling and lens mounting features. The conductive body 62 can be formed from a single conductor cooled by either a single cooling element or multiple cooling elements and can be arranged in contact either continuously or discontinuously with the periphery 58 of the lens 50. Alternatively, the conductive body can be composed of a plurality of conductors each cooled by a separate cooling element.

The cooling elements 66 are preferably composed of one or more thermoelectric devices, such as the type that includes n and p-type semiconductor legs that are connected electrically in series and thermally in parallel between two ceramic plates. A temperature difference is developed between the plates by the application of an electrical current between dissimilar materials in accordance with the so-called Peltier effect. Alternatively, changes in fluid pressure or other refrigeration techniques can be used to extract heat from the lens 50.

Transfers of heat from the lens 50 or other optical elements subject to similar energy transmissions can be enhanced by bonding the periphery 58 of the lens 50 or other optical element to the conductive body 62 through a conductive interface such as the thermal interface ring 52. For example, US Patent Application Publication 2005/0082348 published on Apr. 21, 2005, which is hereby incorporated by reference, discloses a method of bonding glass or metal fluoride optical materials to a metal. Ion bombardments remove contaminants from the glass or metal fluoride optical material. A thin film of inert material, including dielectric oxides, such as silica, or metals such as nickel, chromium or their alloys, protects the cleaned surface. A sealant formed from a metallic holding/sealing element, such as an indium metal, bonds the protected glass or metal fluoride optical material to the metal.

Metal fluoride single crystals such as those of the metals of Group IA (lithium and potassium) and IIA (magnesium, calcium, barium and strontium) have applications in many optical systems, and the Group IIA single crystals are considered by some as the materials of choice for optical elements used in excimer laser assemblies operating at less than 300 nm; for example, at 248, 193 and 157 nm. The metal fluoride can have a general formula M'F or $MF_2$ where M' is lithium or potassium and M is magnesium, calcium, barium or strontium. A mixed metal fluoride can contain two or more of the foregoing metal fluorides or one or more of the foregoing metal fluorides together with a fluoride of one or more lanthanum series metals. A high purity fused silica can also be subject to similar metal bonding.

Figure 7:
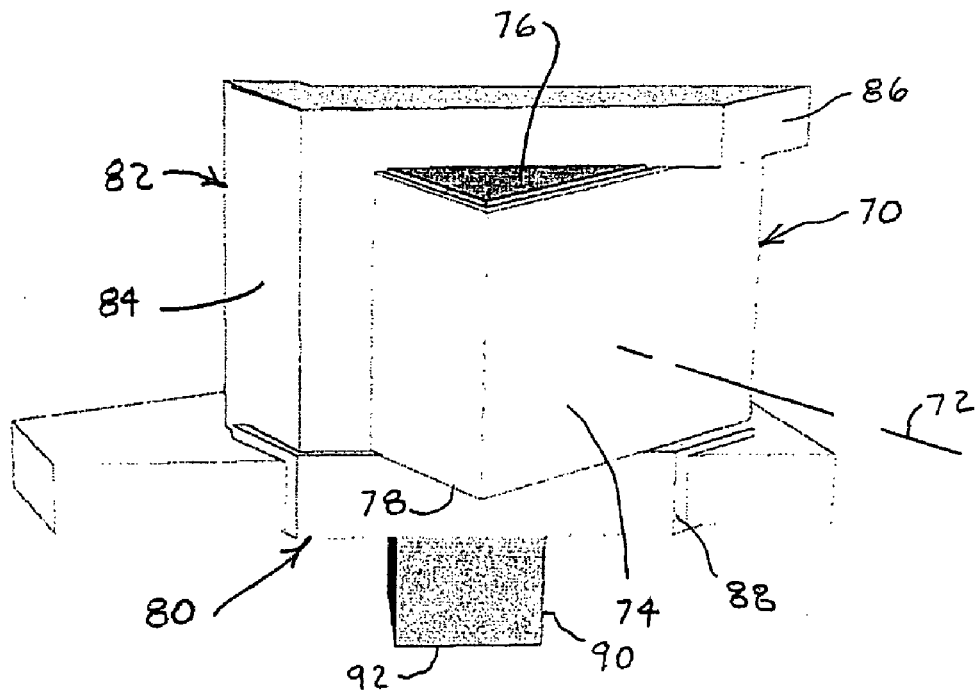
FIG. 7 is a perspective view of a conventional prism engaged with a cooling module mounting system.

A conventional prism 70 made of a crystal optical material such as calcium fluoride is shown in FIG. 7 with an optical axis 72 extending through a prism body 74. A cooling module lens mount 80 engages opposite end surfaces 76 and 78 of the prism body 74. A conductive body 82 (i.e., a thermal conductor) of the cooling module prism mount 80 includes a pedestal 84 and two end plates 86 and 88 for engaging the end surfaces 76 and 78 of the prism body 74. A cooling element 90 engaged with the end plate 88 extracts heat from the opposite end surfaces 76 and 78 of the prism body 74 through the pedestal 84 and the two end plates 86 and 88 of the conductive body 82. Similar to the cooling elements 66 of the preceding embodiment, the cooling element 90 can be composed of one or more thermoelectric devices and includes a heat dissipater 92 for disposing of heat remote from the prism 70.

Alternatively, separate cooling elements could be engaged with the two end plates 86 and 88 to regulate the withdrawal of heat from the opposite end surfaces 76 and 78 of the prism body 74. The two end plates 86 and 88 can be thermally disconnected to provide more independent control over the heat withdrawals from the end surfaces 76 and 78. Heat is preferably withdrawn from the two end surfaces 76 and 78 in an even and balanced manner so that temperature gradients occurring during use remain substantially symmetric with respect to the optical axis 72.

Figure 8:
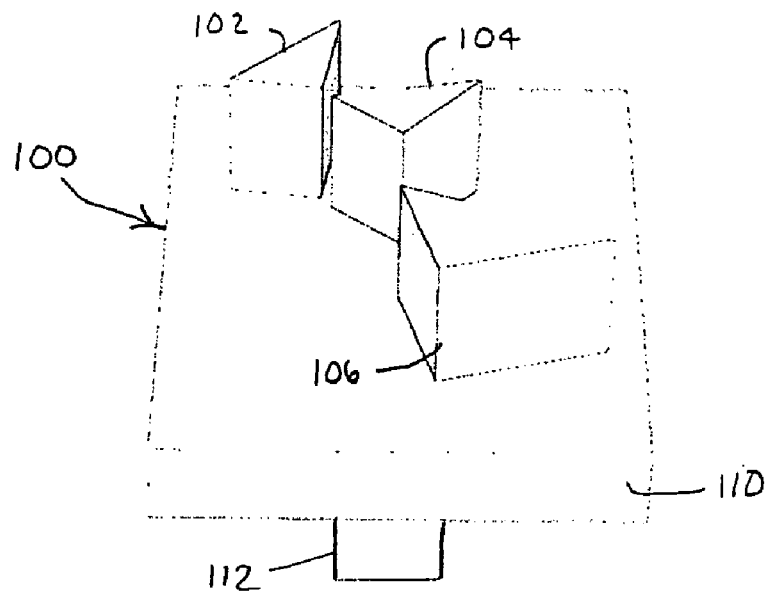
FIG. 8 is a perspective view of a set of prisms collectively mounted on a common cooling module.

FIG. 8 illustrates an arrangement where an active cooling system 100 extracts heat from a plurality of crystal optical elements in the form of prisms 94, 96, and 98. For these purposes, a single thermal conductor 102 and a single powered cooling element 104 are combined to extract heat from one of the end faces of the prisms 94, 96, and 98. A dissipater 106 receives the heat extracted by the powered cooling element 104 through the conductor 102 and disperses or otherwise disposes of the heat remote from the prisms 94, 96, and 98. The common conductor 102 could also be associated with a plurality of powered cooling elements arranged next to the prisms or in a prescribed pattern within the conductor 102. A similar active cooling system can be applied to the opposite end faces of the prisms 94, 96, and 98.

Returning to FIG. 1, a number of the laser beam generating and conditioning components preferably include crystal optics whose transmissivity can be extended through additional numbers of pulse cycles or can be preserved at higher concentrations of light energy through the same numbers of pulse cycles.

Although particular optics are not depicted, two thermally conductive networks 110 and 112 for coupling the particular optics to respective heat exchangers 114 and 116 external to the laser housing 12 are shown. Within the network 110, couplings 122, 124, 126, and 128 convey heat from transmissive optics within the two windows 20 and 22, the line narrowing module 24, and the output coupler 26 to the common heat exchanger (or heat dissipater) 114. Within the network 112, couplings 130, 132, 134, 136, and 138 convey heat from transmissive optics within the beam shaper and aligner 34, the two windows 40 and 42, the beam expander 44 and the pulse extender 46 to the common heat exchanger (or dissipater) 116. Powered thermal modules of the active cooling system can be mounted adjacent to the transmissive crystal optics (e.g., in thermal contact with the heat conductors 62, 82, or 102) within the housing 12 or in other positions in thermal communication with the transmissive crystal optics inside or outside the housing 12. Preferably, the heat extracting portions of the networks 110 and 112 (e.g., the heat conductors 62, 82, or 106) are located within the housing 12 and the heat dissipating portions of the networks 110 and 112 (e.g., the heat dissipaters 68 or 92) are located outside the housing 12. The couplings 122, 124, 126, 128, 130, 132, 134, 136, and 138 complete the thermal connections between the heat extracting and heat dissipating portions of the networks 110 and 112. Controllers 140 and 142, which provide for regulating operation of the networks 110 and 112, can receive input from sensors, such as thermocouples connected to either the transmissive optics or the powered thermal modules, to maintain predetermined temperatures or to vary temperatures according to predetermined profiles associated with the operation of the laser generating apparatus 10. Any changes in the temperatures of the transmissive optics are preferably carried out gradually to avoid introducing stresses that could alter the performance of the optics.

Generally, it is preferable to cool the transmissive optics as much as possible without incurring condensation on the light transmitting surfaces of the transmissive optics. The purged environment within the laser housing 12 is generally low in humidity and deleterious condensation can be avoided by limiting cooling of coldest portion of the transmissive optics within the transmitting region to a temperature above the freezing point of water but preferably less than five degrees Celsius above the freezing point of water. However, the transmissive optics can be cooled below the freezing point of water by more actively managing humidity, such as by incorporating a humidity limiting system 150 with the housing 12. A so-called Meisner trap having a cooling element chilled to near −100° C. can be used for this purpose.

During operation, the portions of the transmissive optics that transmit the highest concentrations of light energy are subject to the most heating, whereas the peripheries of the same transmissive optics are subject to the most cooling. As a result, a temperature gradient can be expected between the heated and cooled regions of the transmissive optics. Preferably, the conductors of the active cooling system are positioned so that the temperature gradients are centered and symmetric to limit the introduction of asymmetric errors in the propagation of the laser beam. The symmetries preferably match the intended symmetries of the optics. For example, the temperature gradients of rotationally symmetric optics are preferably rotationally symmetric, and the temperature gradients of linearly symmetric optics are preferably balanced along the lines of linear symmetry.

The refractive index of many optical materials, including crystal optical materials such as calcium fluoride, is often subject to change with temperature. Thus, the temperature gradients can be expected to result in corresponding variations in refractive index. Where predictable based on theoretical or empirical considerations, the surfaces of the crystal bodies or the refractive indices of the crystal bodies can be varied to compensate for the expected variations in refractive index. For example, one or more transmissive surfaces of the crystal bodies can be modified in shape to compensate for optical path length variations through the crystal bodies produced by temperature gradients within the crystal bodies.

Although described largely with respect to various preferred embodiments, those of skill in the art will appreciate that the invention can be carried out in a variety of other ways in accordance with the teachings set forth in this specification. For example, the invention is depicted with respect to one type of laser design, generally referred to as a master oscillator, power amplifier design, but could also be configured as a master oscillator, power oscillator design, as well as single-chamber designs among others. The enclosed pathway within which the laser beam is propagated is depicted as a housing that collectively encloses the various beam conditioning components of the particular laser design. However, the enclosed pathway could also be arranged in the form of one or more sealed tubes or other local surrounds that enclose the conditioning components in succession or interconnect functional sealed modules containing the components.

The invention claimed is:

1. A method of extending service lives of crystal optics that transmit concentrated laser beams comprising steps of
   generating a laser beam,
   transmitting the laser beam within an enclosed pathway through at least one crystal optic at a power density that progressively degrades transmissivity of the crystal optic with accumulating fluence,
   actively cooling the crystal optic to slow the progressive degradation in the transmissivity of the crystal optic with the accumulating fluence or to accommodate a higher power density without correspondingly increasing the progressive degradation in transmissivity, and
   limiting humidity within the enclosed pathway to avoid condensation of water vapor onto a transmitting region of the actively cooled crystal optic,
   wherein a coldest portion of the crystal optic within the transmitting region is cooled to a temperature above the freezing point of water and less than five degrees Celsius above the freezing point of water.

2. A method of extending service lives of crystal optics that transmit concentrated laser beams comprising steps of
   generating a laser beam,
   transmitting the laser beam within an enclosed pathway through at least one crystal optic at a power density that progressively degrades transmissivity of the crystal optic with accumulating fluence,
   actively cooling the crystal optic to slow the progressive degradation in the transmissivity of the crystal optic with the accumulating fluence or to accommodate a higher power density without correspondingly increasing the progressive degradation in transmissivity, and
   limiting humidity within the enclosed pathway to avoid condensation of water vapor onto a transmitting region of the actively cooled crystal optic, including actively cooling a portion of the space within the enclosed pathway to a temperature less than a contemporaneous temperature of the transmitting region of the crystal optic,
   wherein a coldest portion of the crystal optic within the transmitting region is cooled to a temperature below the freezing point of water.

3. A method of extending service lives of crystal optics that transmit concentrated laser beams comprising steps of
   generating a laser beam,
   transmitting the laser beam within an enclosed pathway through at least one crystal optic at a power density that progressively degrades transmissivity of the crystal optic with accumulating fluence, and
   actively cooling the crystal optic to slow the progressive degradation in the transmissivity of the crystal optic with the accumulating fluence or to accommodate a higher power density without correspondingly increasing the progressive degradation in transmissivity,
   wherein the crystal optic is made of a compound that is assembled from ions that include fluoride and the step of actively cooling includes actively cooling the crystal optic so that fluoride ions dissociated from their cations by the transmitted laser beam remain close enough to their cations to enable reassembly of the fluoride compound between photon interactions.

4. A method of extending service lives of crystal optics that transmit concentrated laser beams comprising steps of
   generating a laser beam,
   transmitting the laser beam within an enclosed pathway through at least one crystal optic at a power density that progressively degrades transmissivity of the crystal optic with accumulating fluence, and
   actively cooling the crystal optic to slow the progressive degradation in the transmissivity of the crystal optic with the accumulating fluence or to accommodate a higher power density without correspondingly increasing the progressive degradation in transmissivity,
   wherein the step of actively cooling the crystal optic includes progressively reducing the temperature of the crystal optic at a rate that limits stress induced by temperature gradients with the crystal optic.

5. A method of extending service lives of crystal optics that transmit concentrated laser beams comprising steps of
   generating a laser beam,
   transmitting the laser beam within an enclosed pathway through at least one crystal optic at a power density that progressively degrades transmissivity of the crystal optic with accumulating fluence, and
   actively cooling the crystal optic to slow the progressive degradation in the transmissivity of the crystal optic with the accumulating fluence or to accommodate a higher power density without correspondingly increasing the progressive degradation in transmissivity,
   wherein the step of transmitting includes transmitting the laser beam along an optical axis of the crystal optic and the step of actively cooling the crystal optic includes maintaining within the crystal optic temperature gradients that are symmetric with respect to the optical axis.

6. The method of claim 5 in which the step of actively cooling the crystal optic includes extracting heat from the crystal optic through a plurality of positions about a periphery of the crystal optic.

7. The method of claim 6 in which conductive pathways for extracting heat from the crystal optic compensate for asymmetric laser beam shapes to maintain the symmetric temperature gradients about the optical axis.

8. A method of extending service lives of crystal optics that transmit concentrated laser beams comprising steps of generating a laser beam, transmitting the laser beam within an enclosed pathway through at least one crystal optic at a power density that progressively degrades transmissivity of the crystal optic with accumulating fluence, actively cooling the crystal optic to slow the progressive degradation in the transmissivity of the crystal optic with the accumulating fluence or to accommodate a higher power density without correspondingly increasing the progressive degradation in transmissivity, and modifying a transmissive surface of the crystal optic in shape to compensate for optical path length variations through the crystal optic produced by temperature gradients within the crystal optic.

* * * * *